US010256104B2

(12) United States Patent
Kimba

(10) Patent No.: US 10,256,104 B2
(45) Date of Patent: Apr. 9, 2019

(54) FILM THICKNESS MEASURING METHOD, FILM THICKNESS MEASURING APPARATUS, POLISHING METHOD, AND POLISHING APPARATUS

(71) Applicant: EBARA CORPORATION, Tokyo (JP)

(72) Inventor: Toshifumi Kimba, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 15/564,182

(22) PCT Filed: Apr. 5, 2016

(86) PCT No.: PCT/JP2016/061100
§ 371 (c)(1),
(2) Date: Oct. 3, 2017

(87) PCT Pub. No.: WO2016/163352
PCT Pub. Date: Oct. 13, 2016

(65) Prior Publication Data
US 2018/0130667 A1 May 10, 2018

(30) Foreign Application Priority Data
Apr. 8, 2015 (JP) ................................. 2015-079459

(51) Int. Cl.
*G01B 11/28* (2006.01)
*H01L 21/304* (2006.01)
(Continued)

(52) U.S. Cl.
CPC .......... *H01L 21/304* (2013.01); *B24B 37/013* (2013.01); *B24B 37/107* (2013.01);
(Continued)

(58) Field of Classification Search
CPC ..... H01L 21/304; B24B 37/013; B24B 49/04; B24B 49/12; G01B 11/06; G01B 11/0625; G01B 11/0683
See application file for complete search history.

(56) References Cited

U.S. PATENT DOCUMENTS

2002/0163649 A1 11/2002 Hirose et al.
2013/0109278 A1* 5/2013 Kimba .................... B24B 49/04
451/5

FOREIGN PATENT DOCUMENTS

JP 2009-092454 A 4/2009
JP 2009092454 A * 4/2009 ............. G01B 11/06
(Continued)

OTHER PUBLICATIONS

International Patent Application No. PCT/JP2016/061100; Int'l Search Report; dated Jun. 28, 2016; 4 pages.

*Primary Examiner* — Jamil Ahmed
(74) *Attorney, Agent, or Firm* — Baker & Hostetler LLP

(57) ABSTRACT

The present invention relates to a film-thickness measuring method for detecting a film thickness by analyzing optical information contained in a reflected light from a substrate. The film-thickness measuring method includes producing a spectral waveform indicating a relationship between intensity and wavelength of reflected light from a substrate; performing Fourier transform processing on the spectral waveform to determine strengths of frequency components and corresponding film thicknesses; determining local maximum values (M1, M2) of the strengths of the frequency components; and selecting, according to a preset selection rule, one film thickness from film thicknesses (t1, t2) corresponding respectively to the local maximum values (M1, M2). The selection rule is either to select an N-th largest film
(Continued)

thickness or to select an N-th smallest film thickness, and N is a predetermined natural number.

18 Claims, 12 Drawing Sheets

(51) Int. Cl.
  *B24B 37/013* (2012.01)
  *B24B 49/04* (2006.01)
  *B24B 49/12* (2006.01)
  *G01B 11/06* (2006.01)
  *B24B 37/10* (2012.01)
  *B24B 37/20* (2012.01)
  *H01L 21/66* (2006.01)

(52) U.S. Cl.
  CPC ............ *B24B 37/205* (2013.01); *B24B 49/04* (2013.01); *B24B 49/12* (2013.01); *G01B 11/06* (2013.01); *G01B 11/0625* (2013.01); *G01B 11/0683* (2013.01); *H01L 22/12* (2013.01); *H01L 22/26* (2013.01)

(56) References Cited

FOREIGN PATENT DOCUMENTS

| | | |
|---|---|---|
| JP | 2013-110390 A | 6/2013 |
| JP | 2013-222856 A | 10/2013 |
| JP | 2014-216457 A | 11/2014 |
| JP | 2015-008303 | 1/2015 |

\* cited by examiner

FILM THICKNESS MEASURING METHOD, FILM THICKNESS MEASURING APPARATUS, POLISHING METHOD, AND POLISHING APPARATUS

CROSS-REFERENCE TO RELATED APPLICATIONS

This application is a 371 U.S. National Stage Application of Patent Application No. PCT/JP2016/061100, filed Apr. 5, 2016, which claims priority to Japanese Patent Application No. 2015-079459, filed Apr. 8, 2015. The entire contents of which are hereby incorporated by reference.

TECHNICAL FIELD

The present invention relates to a film-thickness measuring method and a film-thickness measuring apparatus for a substrate (e.g., wafer) having a film formed on a surface thereof, and more particularly to a film-thickness measuring method and a film-thickness measuring apparatus for detecting a film thickness by analyzing optical information contained in a reflected light from a substrate. The present invention further relates to a polishing method and a polishing apparatus using such a film-thickness measuring method and a film-thickness measuring apparatus.

BACKGROUND ART

Semiconductor devices are manufactured through several processes including a process of polishing a dielectric film, e.g., $SiO_2$, and a process of polishing a metal film, e.g., copper or tungsten. Manufacturing processes of backside illumination CMOS sensor and through-silicon via (TSV) include a process of polishing a silicon layer (silicon wafer), in addition to the polishing processes of the dielectric film and the metal film.

Polishing of a wafer is terminated when a thickness of a film (e.g., the dielectric film, the metal film, or the silicon layer), constituting a wafer surface, has reached a predetermined target value. Therefore, the thickness of the film is measured during polishing of the wafer. An optical film-thickness measuring method, disclosed in a patent documents 1, 2, is one example of a film-thickness measuring method. This method includes the steps of directing light from a film-thickness sensor to a wafer during polishing of the wafer, obtaining a spectral waveform indicating a relationship between intensity and frequency of reflected light from the wafer, obtaining a frequency spectrum by performing a Fourier transform processing on the spectral waveform, and determining a film thickness from a peak of the frequency spectrum obtained.

FIG. 12 is a graph showing an example of the spectral waveform. In FIG. 12, vertical axis represents relative reflectance indicating the intensity of the reflected light from the wafer, and horizontal axis represents frequency of the reflected light. The relative reflectance is an index value that represents the intensity of the reflected light. Specifically, the relative reflectance is a ratio of the intensity of the light to a predetermined reference intensity. By dividing the intensity of the light (i.e., the actually measured intensity) at each wavelength by a predetermined reference intensity, unwanted noises, such as a variation in the intensity inherent in an optical system or the light source of the apparatus, are removed from the actually measured intensity.

The reference intensity is an intensity that has been obtained in advance at each of the wavelengths. The relative reflectance is calculated at each of the wavelengths. Specifically, the relative reflectance is determined by dividing the intensity of the light (the actual intensity) at each wavelength by the corresponding reference intensity. The reference intensity is obtained by directly measuring the intensity of light emitted from a film-thickness sensor, or by irradiating a mirror with light from a film-thickness sensor and measuring the intensity of reflected light from the mirror. Alternatively, the reference intensity may be an intensity of the reflected light obtained when a silicon wafer (bare wafer) with no film thereon is being water-polished in the presence of water. In the actual polishing process, a dark level (which is a background intensity obtained under the condition that the light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. That is, the relative reflectance $R(\lambda)$ can be calculated by using $$R(\lambda) = \frac{E(\lambda) - D(\lambda)}{B(\lambda) - D(\lambda)}$$

where $\lambda$ is wavelength, $E(\lambda)$ is the intensity of the light reflected from the wafer at the wavelength $\lambda$, $B(\lambda)$ is the reference intensity at the wavelength $\lambda$, and $D(\lambda)$ is the background intensity (i.e., dark level) at the wavelength $\lambda$ obtained under the condition that the light is cut off.

FIG. 13 is a graph showing the frequency spectrum obtained by performing the Fourier transform processing on the spectral waveform shown in FIG. 12. In FIG. 13, vertical axis represents strength of a frequency component contained in the spectral waveform, and horizontal axis represents film thickness. The strength of the frequency component corresponds to an amplitude of the frequency component which is expressed as sine wave. The frequency component contained in the spectral waveform is converted into a film thickness with use of a predetermined relational expression, so that the frequency spectrum as shown in FIG. 13 is generated. This frequency spectrum represents a relationship between the film thickness and the strength of the frequency component. The above-mentioned predetermined relational expression is a linear function representing the film thickness and having the frequency component as variable. This linear function can be obtained from actual measurement results, an optical film-thickness measurement simulation, or other process.

In the graph shown in FIG. 13, the strength of the frequency component becomes maximum at a film thickness of t1. That is, this frequency spectrum indicates that the film thickness is t1. In this manner, the film thickness is determined from the peak of the frequency spectrum.

CITATION LIST

Patent Literature

Patent document 1: Japanese laid-open patent publication No. 2013-110390
Patent document 2: Japanese laid-open patent publication No. 2014-216457

SUMMARY OF INVENTION

Technical Problem

The spectral waveform shown in FIG. 12 and the frequency spectrum shown in FIG. 13 are produced with use of the reflected light from a wafer structure shown in FIG. 14. The film thickness t1 obtained from the frequency spectrum shown in FIG. 13 represents a thickness of an exposed layer 100 formed on an underlying layer 101 shown in FIG. 14. However, as shown in FIG. 15, due to the existence of a lower layer 102 under the underlying layer 101, the optical information contained in the reflected light may change. In another example, as shown in FIG. 16, due to the existence of a stepped portion formed in the underlying layer 101, the thickness of the exposed layer 100 may vary from region to region. In these cases, as shown in FIG. 17, the spectral waveform deforms, and as a result, multiple peaks appear on the frequency spectrum, as shown in FIG. 18. Typically, a low strength of the frequency component, i.e., a low-level peak, often represents a noise. Thus, in the case where there are multiple peak values, a film thickness corresponding to the highest peak value is selected as a measurement result. According to this rule, in the example of FIG. 18, the film thickness t1 corresponding to the highest peak value is selected.

However, the peak value (or the local maximum value) may vary depending on a measurement point on a wafer. For example, a frequency spectrum as shown in FIG. 18 is obtained at a first measurement point on a wafer, while a frequency spectrum as shown in FIG. 19 is obtained at a second measurement point on the wafer. Further, a frequency spectrum as shown in FIG. 18 may be obtained again at a third measurement point on the wafer.

Such a variation in the peak value (local maximum value) is due to an area ratio of a region having the film thickness t1 to a region having the film thickness t2, noise, or other causes. In particular, when the film thickness is measured while the wafer is being polished, the wafer and the film-thickness sensor move relative to each other. As a result, the light illuminates a relatively wide region, and hence the peak value is likely to change. In this manner, the peak value can change depending on measurement point, and the film thickness, to be selected, also change depending on measurement point.

It is therefore an object of the present invention to provide a film-thickness measuring method and a film-thickness measuring apparatus capable of measuring an accurate film thickness without being affected by a substrate structure and a measuring condition. Further, it is an object of the present invention to provide a polishing method and a polishing apparatus using such a film-thickness measuring method and a film-thickness measuring apparatus.

Solution to Problem

In order to achieve the above object, according to one aspect of the present invention, there is provided a film-thickness measuring method comprising: directing light to a substrate having a film formed on a surface thereof; producing a spectral waveform indicating a relationship between intensity and wavelength of reflected light from the substrate; performing Fourier transform processing on the spectral waveform to determine strengths of frequency components and corresponding film thicknesses; determining a plurality of local maximum values of the strengths of the frequency components; and selecting, according to a preset selection rule, one film thickness from a plurality of film thicknesses corresponding respectively to the plurality of local maximum values.

In a preferred aspect of the present invention, the plurality of local maximum values are determined based on a comparison threshold value.

In a preferred aspect of the present invention, the threshold value is a value determined from a previous measurement result of a film thickness.

In a preferred aspect of the present invention, the preset selection rule is either to select an N-th largest film thickness or to select an N-th smallest film thickness, N being a predetermined natural number.

In a preferred aspect of the present invention, the preset selection rule is predetermined based on a result of measuring a film thickness of a reference substrate having the same structure as said substrate, measuring of the film thickness of the reference substrate being performed with the same process as measuring of a film thickness of said substrate.

In a preferred aspect of the present invention, measuring of the film thickness of the reference substrate is performed while water-polishing the reference substrate.

In a preferred aspect of the present invention, a process of determining the selection rule comprises: calculating a magnitude of fluctuation of each of a plurality of local maximum values which are determined during measuring of the film thickness of the reference substrate; and selecting a film thickness corresponding to a local maximum value whose magnitude of fluctuation is the smallest.

In a preferred aspect of the present invention, a process of determining the selection rule comprises: comparing a plurality of local maximum values with each other each time the local maximum values are determined during measuring of the film thickness of the reference substrate, thereby determining a largest local maximum value; identifying a film thickness corresponding to the largest local maximum value; and selecting a film thickness which has been most frequently identified.

According to another aspect of the present invention, there is provided a film-thickness measuring apparatus comprising: a light emitter configured to direct light to a substrate having a film formed on a surface thereof; a light receiver configured to receive reflected light from the substrate; a spectrometer configured to measure an intensity of the reflected light at each of wavelengths; and a processor configured to produce a spectral waveform indicating a relationship between intensity and wavelength of the reflected light, the processor being configured to perform Fourier transform processing on the spectral waveform to determine strengths of frequency components and corresponding film thicknesses, determine a plurality of local maximum values of the strengths of the frequency components, and select, according to a preset selection rule, one film thickness from a plurality of film thicknesses corresponding respectively to the plurality of local maximum values.

In a preferred aspect of the present invention, the processor is configured to determine the plurality of local maximum values based on a comparison with a threshold value.

In a preferred aspect of the present invention, the preset selection rule is either to select an N-th largest film thickness or to select an N-th smallest film thickness, N being a predetermined natural number.

According to still another aspect of the present invention, there is provided a polishing method comprising: directing light to a substrate having a film formed on a surface thereof while rubbing the substrate against a polishing surface;

producing a spectral waveform indicating a relationship between intensity and wavelength of reflected light from the substrate; performing Fourier transform processing on the spectral waveform to determine strengths of frequency components and corresponding film thicknesses; determining a plurality of local maximum values of the strengths of the frequency components; and selecting, according to a preset selection rule, one film thickness from a plurality of film thicknesses corresponding respectively to the plurality of local maximum values.

In a preferred aspect of the present invention, the polishing method further comprises terminating polishing of the substrate when the selected film thickness reaches a preset target value.

In a preferred aspect of the present invention, the polishing method further comprises calculating a corrected target value by adding an offset value to the target value, wherein polishing of the substrate is terminated when the selected film thickness reaches the corrected target value.

In a preferred aspect of the present invention, the plurality of local maximum values are determined based on a comparison with a threshold value.

In a preferred aspect of the present invention, the preset selection rule is either to select an N-th largest film thickness or to select an N-th smallest film thickness, N being a predetermined natural number.

According to still another aspect of the present invention, there is provided a polishing apparatus comprising: a polishing table configured to support a polishing pad having a polishing surface; a polishing head configured to press a substrate, having a film formed on a surface thereof, against the polishing surface; a light emitter configured to direct light to the substrate; a light receiver configured to receive reflected light from the substrate; a spectrometer configured to measure an intensity of the reflected light at each of wavelengths; a processor configured to produce a spectral waveform indicating a relationship between intensity and wavelength of the reflected light; and a polishing controller configured to control polishing of the substrate, the processor being configured to: perform Fourier transform processing on the spectral waveform to determine strengths of frequency components and corresponding film thicknesses, determine a plurality of local maximum values of the strengths of the frequency components, and select, according to a preset selection rule, one film thickness from a plurality of film thicknesses corresponding respectively to the plurality of local maximum values.

In a preferred aspect of the present invention, the polishing controller is configured to terminate polishing of the substrate when the selected film thickness reaches a preset target value.

In a preferred aspect of the present invention, the polishing controller is configured to calculate a corrected target value by adding an offset value to the target value, and terminate polishing of the substrate when the selected film thickness reaches the corrected target value.

In a preferred aspect of the present invention, the processor is configured to determine the plurality of local maximum values based on a comparison with a threshold value.

In a preferred aspect of the present invention, the preset selection rule is either to select an N-th largest film thickness or to select an N-th smallest film thickness, N being a predetermined natural number.

Advantageous Effects of Invention

Unlike the conventional method in which a film thickness is selected based on a peak level of a frequency spectrum, a film thickness is selected according to the preset selection rule. Specifically, the N-th largest film thickness or the N-th smallest film thickness is selected. Therefore, stable measuring of the film-thickness can be achieved without being affected by the variation in the local maximum value (or peak value).

DESCRIPTION OF EMBODIMENTS

Figure 1:
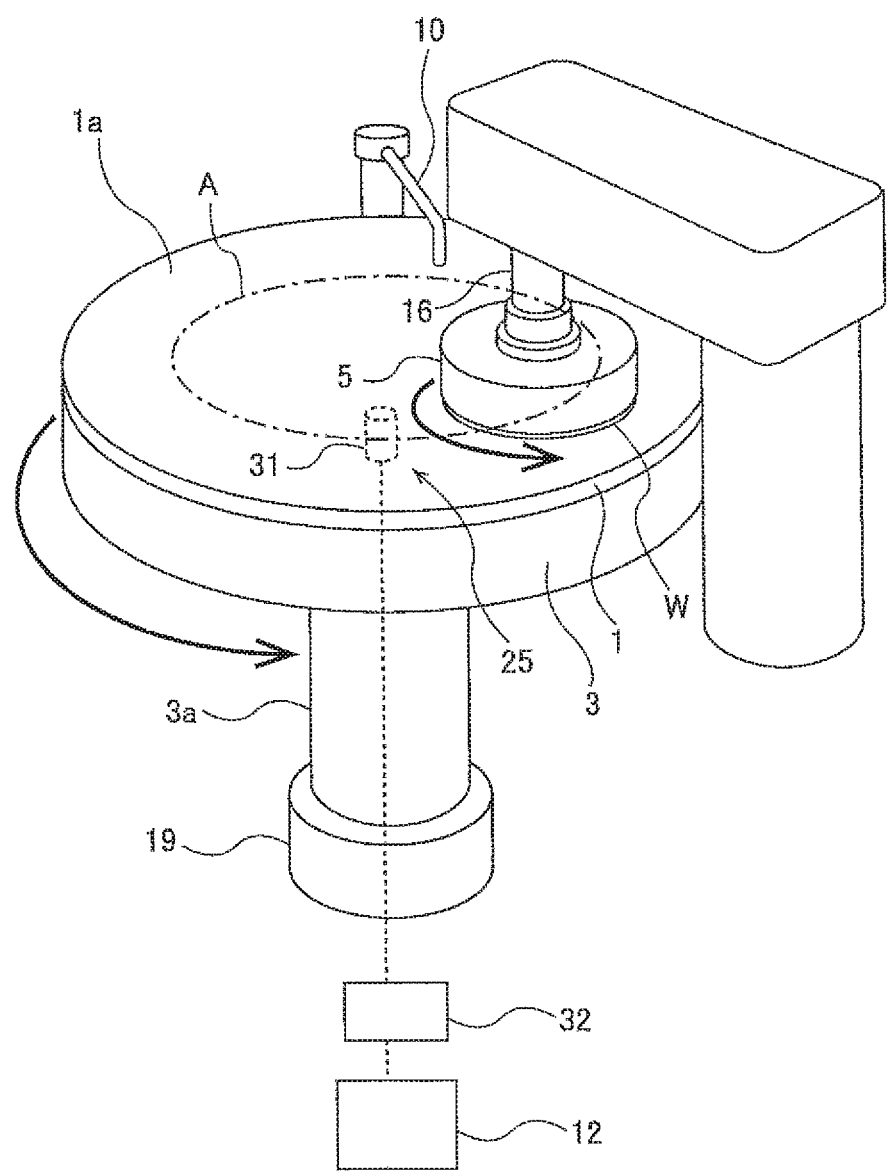
FIG. 1 is a view showing a polishing apparatus according to an embodiment.

Embodiments of the present invention will be described below with reference to the drawings. FIG. 1 is a view showing a polishing apparatus according to an embodiment of the present invention. As shown in FIG. 1, the polishing apparatus includes a polishing table 3 to which a polishing pad 1 having a polishing surface 1a is attached, a polishing head 5 for holding a wafer W, which is an example of a substrate, and polishing the wafer W while pressing it against the polishing pad 1 on the polishing table 3, a polishing-liquid supply nozzle 10 for supplying a polishing liquid (e.g., a slurry) onto the polishing pad 1, and a polishing controller 12 for controlling polishing of the wafer W.

The polishing table 3 is coupled to a table motor 19 through a table shaft 3a. The table motor 19 is disposed below the polishing table 3, and is configured to rotate the polishing table 3 in a direction indicated by arrow. The polishing pad 1 is attached to an upper surface of the polishing table 3. The polishing pad 1 has an upper surface serving as the polishing surface 1a for polishing the wafer W. The polishing head 5 is coupled to a lower end of a polishing head shaft 16. The polishing head 5 is configured to be able to hold the wafer W on its lower surface by vacuum suction. The polishing head shaft 16 can be moved up and down by an elevating mechanism which is not shown in the drawings.

Polishing of the wafer W is performed as follows. The polishing head 5 and the polishing head 3 are rotated individually in directions indicated by arrows, and the polishing-liquid supply nozzle 10 supplies the polishing liquid (or slurry) onto the polishing pad 1. While the polishing liquid is being supplied, the polishing head 5 presses the wafer W against the polishing surface 1a of the polishing pad 1. The surface of the wafer W is polished by a mechanical action of abrasive grains contained in the polishing liquid and a chemical action of the polishing liquid.

The polishing apparatus includes an optical film-thickness measuring device (or a film-thickness measuring apparatus) 25 for measuring a film thickness of the wafer W. This optical film-thickness measuring device 25 includes a film-thickness measuring head 31 for obtaining an optical signal that varies in accordance with a film thickness of the wafer W, and a processor 32 for determining a film thickness from the optical signal. The film-thickness measuring head 31 is disposed in the polishing table 3, and the processor 32 is coupled to the polishing controller 12. The film-thickness measuring head 31 rotates together with the polishing table 3 as indicated by arrow A, and obtains the optical signal of the wafer W held on the polishing head 5. The film-thickness measuring head 31 is coupled to the processor 32 so that the optical signal, obtained by the film-thickness measuring head 31, is sent to the processor 32.

Figure 2:
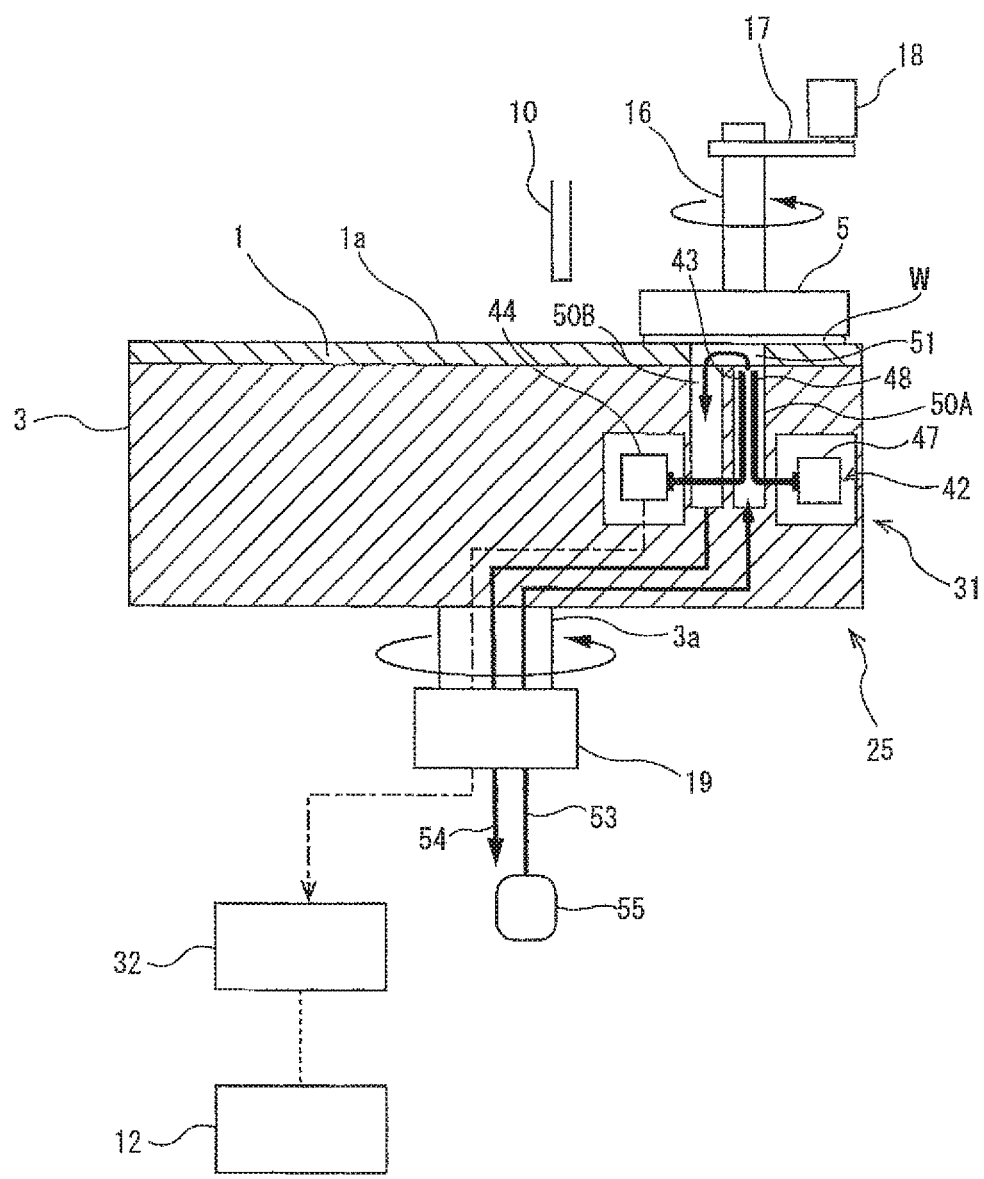
FIG. 2 is a schematic cross-sectional view showing a polishing apparatus having an optical film-thickness measuring device according to an embodiment.

FIG. 2 is a schematic cross-sectional view showing the polishing apparatus having the optical film-thickness measuring device 25. The polishing head shaft 16 is coupled to a polishing head motor 18 through a coupling device 17, such as belt, so that the polishing head shaft 16 is rotated by the polishing head motor 18. This rotation of the polishing head shaft 16 is transmitted to the polishing head 5 to rotate the polishing head 5 in the direction indicated by arrow.

As described previously, the optical film-thickness measuring device 25 includes the film-thickness measuring head 31 and the processor 32. The film-thickness measuring head 31 is configured to direct light to the surface of the wafer W, receive the light reflected from the wafer W, and break up the reflected light according to wavelength. The film-thickness measuring head 31 includes a light emitter 42 for irradiating the surface, to be polished, of the wafer W with the light, an optical fiber 43 as a light receiver for receiving the reflected light from the wafer W, a spectrometer 44 configured to resolve the reflected light according to wavelength and measure the intensity of the reflected light over a predetermined wavelength range.

The polishing table 3 has a first hole 50A and a second hole 50B having upper open ends lying in the upper surface of the polishing table 3. The polishing pad 1 has a through-hole 51 at a position corresponding to the holes 50A and 50B. The holes 50A and 50B are in fluid communication with the through-hole 51, which has an upper open end lying in the polishing surface 1a. The first hole 50A is coupled to a liquid supply source 55 via a liquid supply passage 53 and a rotary joint (not shown). The second hole 50B is coupled to a liquid discharge passage 54.

The light emitter 42 includes a light source 47 for emitting multiwavelength light and an optical fiber 48 coupled to the light source 47. The optical fiber 48 is an optical transmission element for transmitting the light, emitted by the light source 47, to the surface of the wafer W. The distal ends of the optical fiber 48 and the optical fiber 43 lie in the first hole 50A and are located near the surface, to be polished, of the wafer W. The distal ends of the optical fiber 48 and the optical fiber 43 are arranged so as to sweep across the surface, to be polished, of the wafer W held by the polishing head 5, so that multiple areas of the wafer W are irradiated with the light each time the polishing table 3 makes one revolution.

During polishing of the wafer W, the liquid supply source 55 supplies water (preferably pure water) as a transparent liquid into the first hole 50A through the liquid supply passage 53. The water fills a space formed between the lower surface of the wafer W and the distal ends of the optical fibers 48, 43. The water further flows into the second hole 50B and is expelled therefrom through the liquid discharge passage 54. The polishing liquid is discharged together with the water and thus a path of light is ensured. The liquid supply passage 53 is provided with a valve (not shown in the drawing) configured to operate in conjunction with the rotation of the polishing table 3. The valve operates so as to stop the flow of the water or reduce the flow of the water when the wafer W is not located over the through-hole 51.

The optical fiber 48 and the optical fiber 43 are arranged in parallel with each other. The distal ends of the optical fiber 48 and the optical fiber 43 are perpendicular to the surface of the wafer W, so that the optical fiber 48 casts the light onto the surface of the wafer W perpendicularly.

During polishing of the wafer W, the light emitter 42 directs the light to the wafer W, and the optical fiber (or the light receiver) 43 receives the reflected light from the wafer W. The spectrometer 44 measures the intensity of the reflected light at each of the wavelengths over the predetermined wavelength range and sends light intensity data to the processor 32. The light intensity data is the optical signal reflecting the film thickness of the wafer W, and contains intensities of the reflected light and corresponding wavelengths. The processor 32 produces a spectral waveform representing the light intensities at the respective wavelengths from the light intensity data, performs Fourier transform processing (e.g. fast Fourier transform processing) on the spectral waveform to produce a frequency spectrum, and determines a film thickness of the wafer W from the frequency spectrum.

Figure 3:
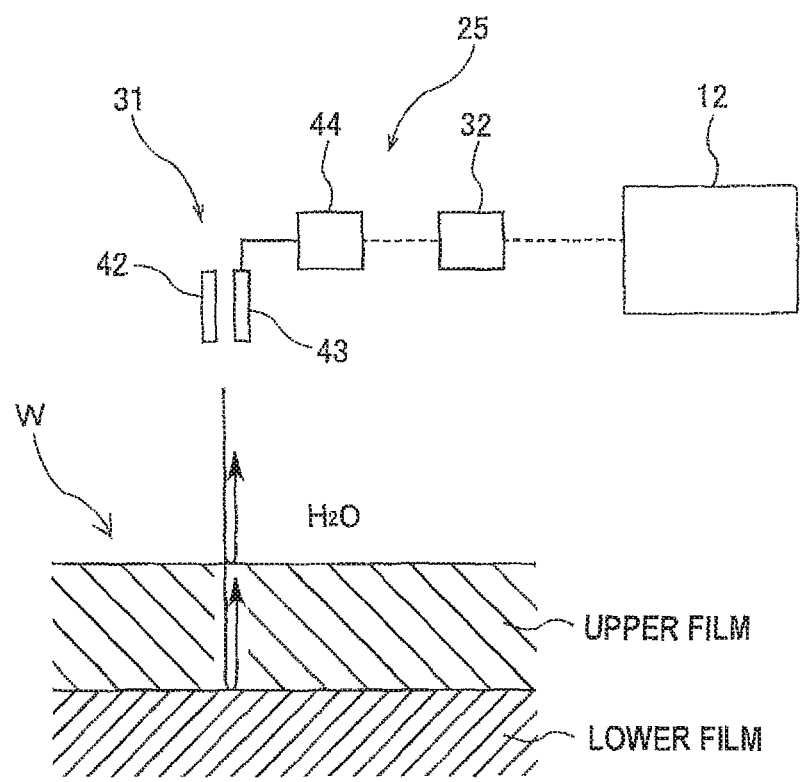
FIG. 3 is a schematic view illustrating the principle of the optical film-thickness measuring device.
Figure 4:
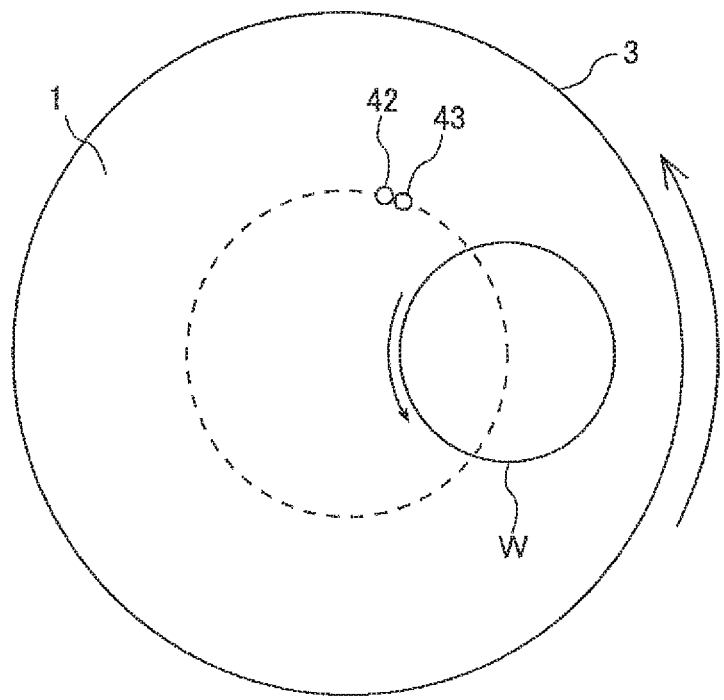
FIG. 4 is a plan view showing a positional relationship between a wafer and a polishing table.

FIG. 3 is a schematic view illustrating the principle of the optical film-thickness measuring device 25, and FIG. 4 is a plan view showing a positional relationship between the wafer W and the polishing table 3. In this example shown in FIG. 3, the wafer W has a lower film and an upper film formed on the lower film. The upper film is a film (i.e., a silicon layer or a dielectric film) which allows the light to pass therethrough. The light emitter 42 and the light receiver 43 are disposed in the polishing table 3 so as to sweep across the surface of the wafer W. Each time the polishing table 3 makes one revolution the light emitter 42 directs the light to multiple measurement points on the wafer W, including the center of the wafer W, while the optical fiber (or the light receiver) 43 receives the reflected light from the multiple measurement points on the wafer W.

Figure 12:
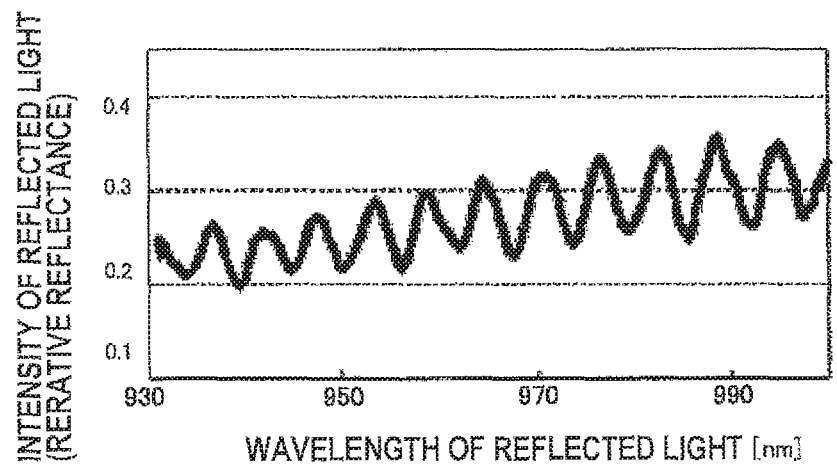
FIG. 12 is a graph showing an example of a spectral waveform.
Figure 13:
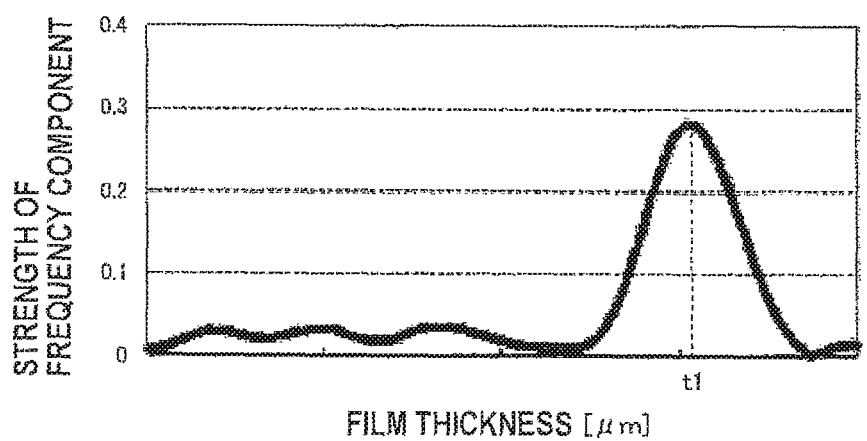
FIG. 13 is a graph showing a frequency spectrum obtained by performing a Fourier transform processing on the spectral waveform shown in FIG. 12.
Figure 14:
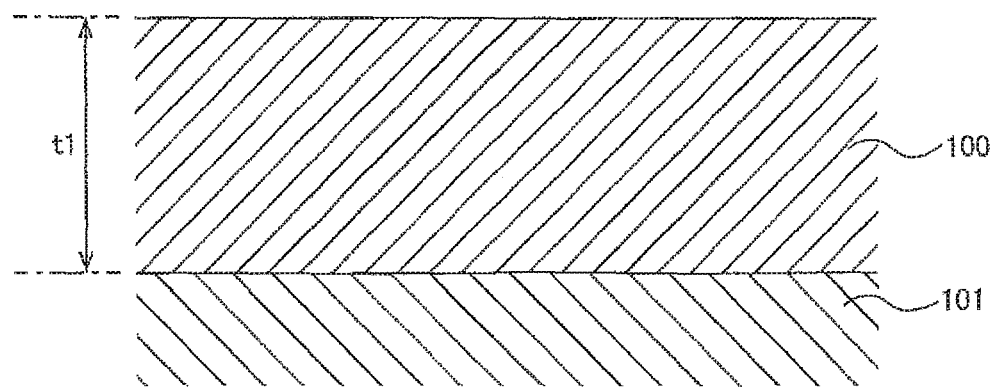
FIG. 14 is a cross-sectional view of an example of a wafer structure.
Figure 15:
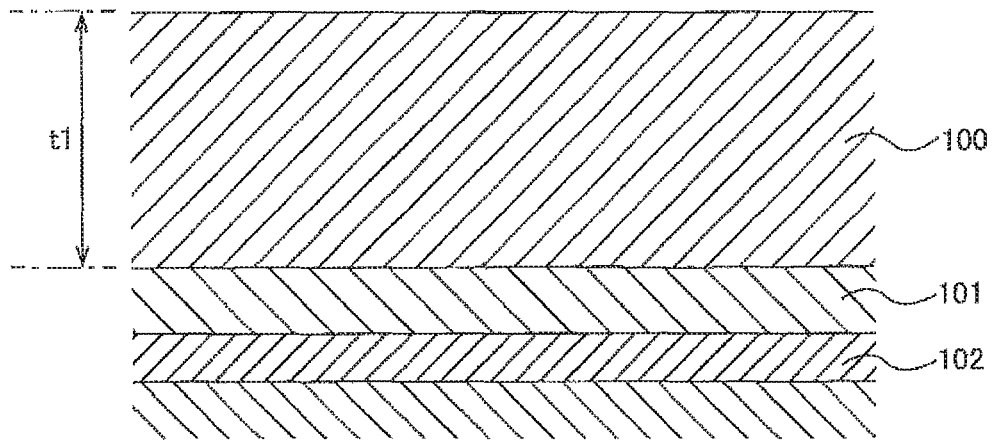
FIG. 15 is a cross-sectional view of another example of a wafer structure.
Figure 17:
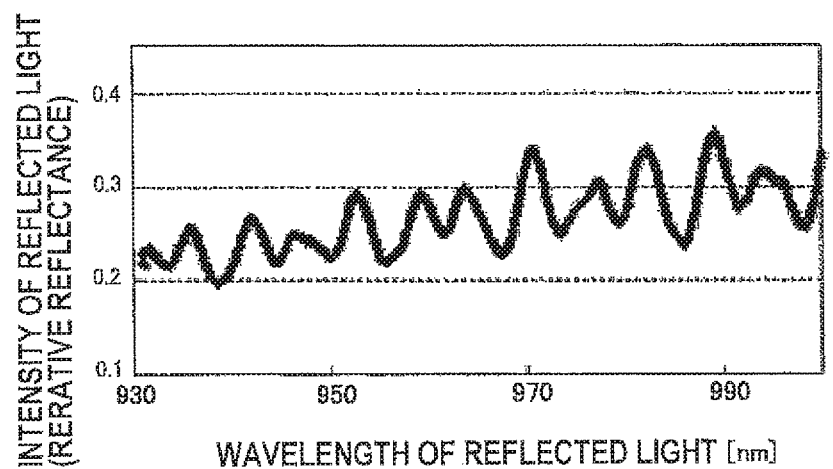
FIG. 17 is a graph showing another example of a spectral waveform.
Figure 18:
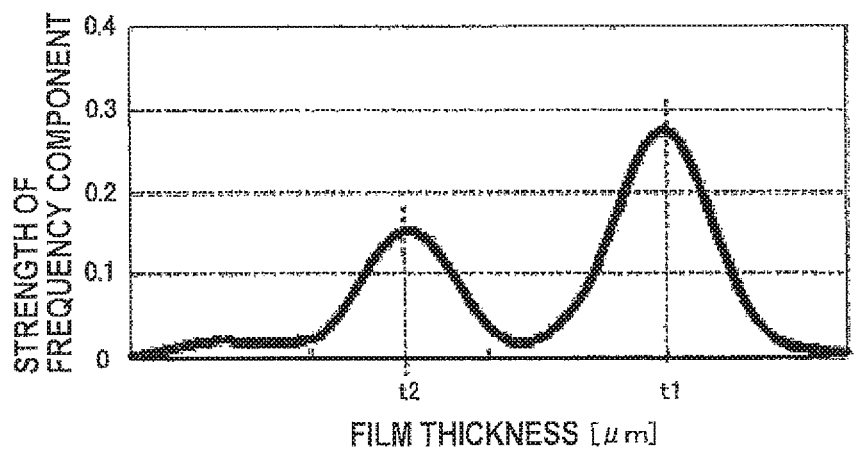
FIG. 18 is a graph showing a frequency spectrum having a plurality of peaks.
Figure 19:
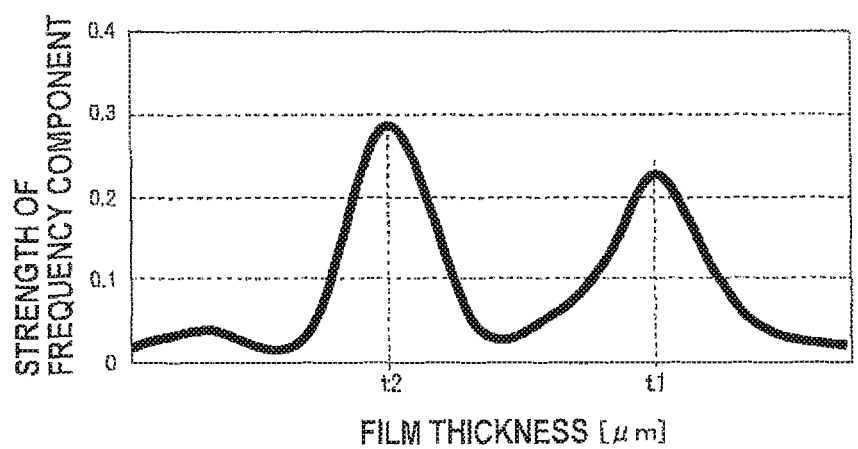
FIG. 19 is a graph showing another example of a frequency spectrum having a plurality of peaks.

The light, which has been directed to the wafer W, is reflected off an interface between a medium (e.g., water in the example of FIG. 3) and the upper film and an interface between the upper film and the lower film. Light waves from these interfaces interfere with each other. The manner of interference between the light waves varies according to the thickness of the upper film (i.e., a length of an optical path). As a result, the spectrum, produced from the reflected light from the wafer, varies according to the thickness of the upper film. The spectrometer 44 breaks up the reflected light according to the wavelength and measures the intensity of the reflected light at each of the wavelengths. The processor 32 produces the spectral waveform from the intensity data of the reflected light (i.e., the optical signal) obtained from the spectrometer 44. This spectral waveform is expressed as a line graph indicating a relationship between the wavelength and the intensity of the light, as shown in FIG. 12 and FIG. 17. The intensity of the light can also be expressed as a relative value, such as the above-discussed relative reflectance.

The processor 32 performs Fourier transform processing (e.g. fast Fourier transform processing) on the spectral waveform obtained to analyze the spectral waveform. More specifically, the processor 32 extracts frequency components contained in the spectral waveform and extracts strengths of the respective frequency components, converts the frequency components into film thicknesses using a predetermined relational expression, and produces a frequency spectrum representing a relationship between film thickness and strength of the frequency component. The above-mentioned predetermined relational expression is a linear function representing the film thickness and having the frequency component as variable. This linear function can be obtained from actual measurement results, an optical film-thickness measurement simulation, or other process.

Figure 5:
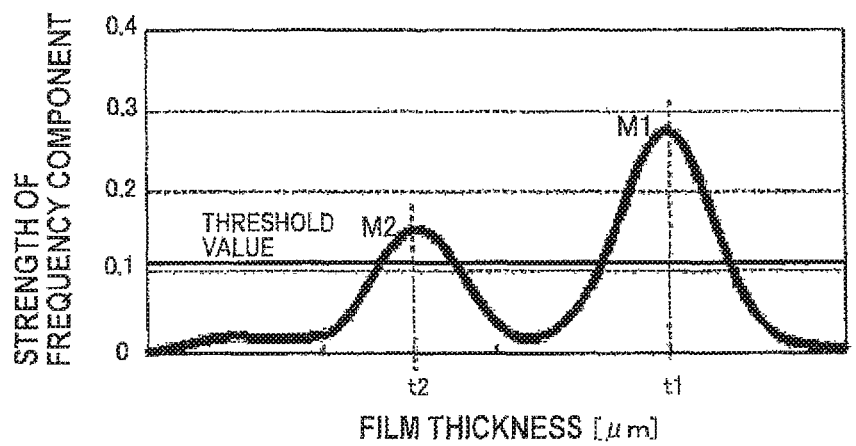
FIG. 5 is a diagram showing a frequency spectrum produced by a processor.

FIG. 5 is a diagram showing a frequency spectrum produced by the processor 32. In FIG. 5, the ordinate axis represents strength of the frequency component contained in the spectral waveform, and the abscissa axis represents film thickness. The strength of the frequency component corresponds to an amplitude of the frequency component that is expressed as a sine wave. A threshold value for the strength of the frequency component is pre-stored in the processor 32. This threshold value is determined from a previous measurement result of a film thickness.

The threshold value is provided for selecting local maximum values of the strength of the frequency component. Specifically, the processor 32 compares all the local maximum values that appear on the frequency spectrum with the threshold value, and determines local maximum values which are not less than the threshold value. Local maximum values which are less than the threshold value are not used for the determination of a film thickness, while the local maximum values which are not less than the threshold value are used for the determination of a film thickness. In the example shown in FIG. 5, two local maximum values M1, M2 are larger than the threshold value, and therefore two film thicknesses t1, t2 at which the local maximum values M1, M2 appear are used for the determination of a film thickness. In other words, the film thicknesses t1, t2 are candidates for a film thickness. Three local maximum values M1, M2, M3 exist in the example shown in FIG. 6. However, the local maximum value M3 is smaller than the threshold value. In this example, therefore, the two film thicknesses t1, t2 at which the local maximum values M1, M2 appear are used for the determination of a film thickness (i.e. t1, t2 are candidates for a film thickness), whereas a film thickness t3 at which the local maximum value M3 appears is not used for the determination of a film thickness.

In accordance with a preset selection rule, the processor 32 selects one film thickness from a plurality of film thicknesses that have been selected as the candidates for a film thickness. The preset selection rule is either to select an N-th largest film thickness or to select an N-th smallest film thickness. N is a predetermined natural number. For example, if the preset selection rule is to select a 1st largest (i.e. the largest) film thickness, the processor 32 selects the thickness t1 from the two film thicknesses t1, t2 shown in FIGS. 5 and 6. If the preset selection rule is to select a 2nd largest film thickness, the processor 32 selects the thickness t2. If the preset selection rule is to select a 1st smallest (i.e. the smallest) film thickness, the processor 32 selects the thickness t2. If the preset selection rule is to select a 2nd smallest film thickness, the processor 32 selects the thickness t1.

In this manner, the processor 32 selects the N-th largest film thickness or the N-th smallest film thickness according to the preset selection rule, instead of selecting a film thickness based on the magnitudes of local maximum values. This embodiment makes it possible to measure a film thickness in a stable manner without being influenced by fluctuation of the local maximum values during measuring of the film thickness. Especially, when a film thickness is measured during polishing of the wafer W, the wafer W and the film-thickness measuring head 31 (and the polishing table 3) are moving relative to each other. Under such conditions, the strength of the frequency component is likely to vary from measurement point to measurement point on the wafer W. Even in such a case, a film thickness can be determined without being influenced by the variation in the strength of the frequency component, because the processor 32 does not make a comparison between the local maximum values of the strength of the frequency component.

The processor 32 outputs, as a film-thickness measurement value, a film thickness that has been selected according to the selection rule. Three or more candidates for a film thickness may exist depending on the threshold value and/or the measurement conditions. Even in such a case, it is possible to select the N-th largest film thickness or the N-th smallest film thickness according to the selection rule.

Figure 7:
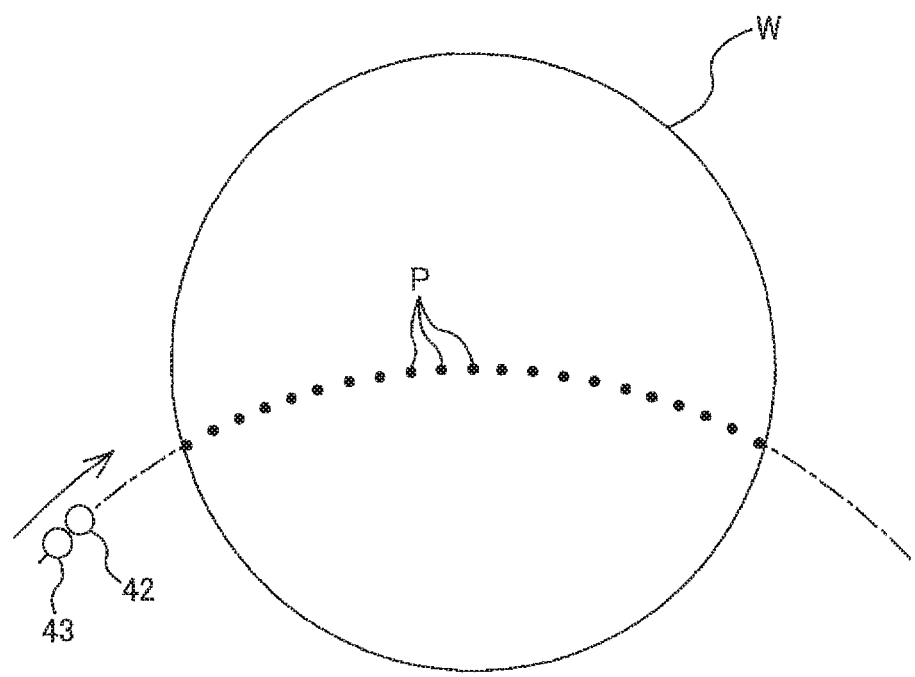
FIG. 7 is a diagram showing multiple measurement points on a wafer.

As shown in FIG. 7, each time the polishing table 3 makes one revolution, the light emitter 42 directs the light to the measurement points P on the wafer W, including the center of the wafer W, while the optical fiber (light receiver) 43 receives the reflected light from the measurement points P. Therefore, each time the light emitter 42 and the optical fiber (or light receiver) 43 of the film-thickness measuring head 31 sweep across the surface of the wafer W, the processor 32 repeatedly performs the above-described film thickness selection at the measurement points P.

The above-described selection rule is predetermined based on a result of measuring of a film thickness of a reference wafer (or a reference substrate) having the same structure as the wafer W to be polished. The measuring of a film thickness of the reference wafer is performed with the same process as the measuring of a film thickness of the wafer W. In particular, the above-described selection rule is determined by directing light to the reference wafer, producing a spectral waveform indicating a relationship between intensity and wavelength of reflected light from the reference wafer, performing Fourier transform processing (e.g. fast Fourier transform processing) on the spectral waveform to determine strengths of frequency components and corresponding film thicknesses, selecting local maximum values of the strengths of the frequency components which are larger than the above threshold value, and analyzing changes in the selected local maximum values with measuring time.

Measuring of the film thickness of the reference wafer is preferably performed during water-polishing of the reference wafer. The water-polishing is a process of rubbing the reference wafer against the polishing pad 1 while supplying pure water, instead of the polishing liquid, onto the polishing pad 1. During the water-polishing, the reference wafer is pressed against the polishing pad 1 with a lower force than that during slurry-polishing of the wafer W. Polishing of the reference wafer does not substantially progress during the water-polishing.

Figure 6:
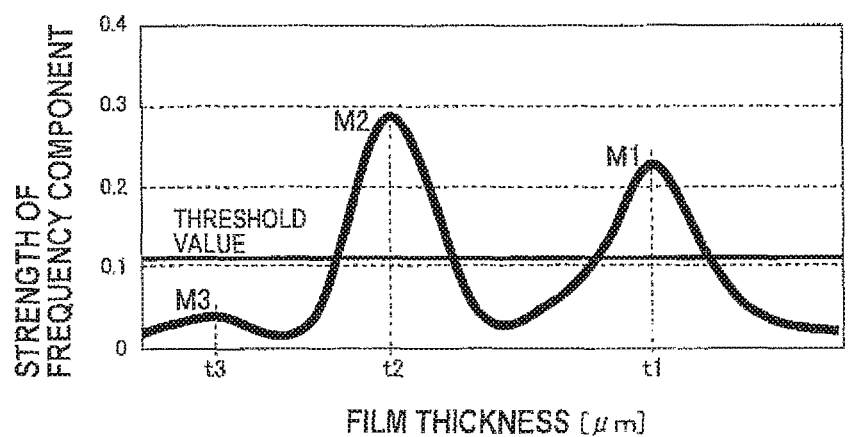
FIG. 6 is a diagram showing another example of a frequency spectrum produced by the processor.

The selection rule is predetermined in the following manner using the measurement result of the film thickness of the reference wafer. In one embodiment, a process of determining the selection rule includes the steps of: calculating a magnitude of fluctuation of each of the selected (determined) local maximum values during the water-polishing of the reference wafer; and selecting a film thickness corresponding to a local maximum value whose magnitude of fluctuation is the smallest, i.e. the most stable local maximum value. In the examples shown in FIGS. 5 and 6, the two local maximum values M1, M2 are selected each time the measuring of a film thickness is performed at each of the measurement points (see the symbol P of FIG. 7) on the reference wafer. As can be seen in FIGS. 5 and 6, the local maximum values M1, M2 can vary from measurement point to measurement point.

Figure 8:
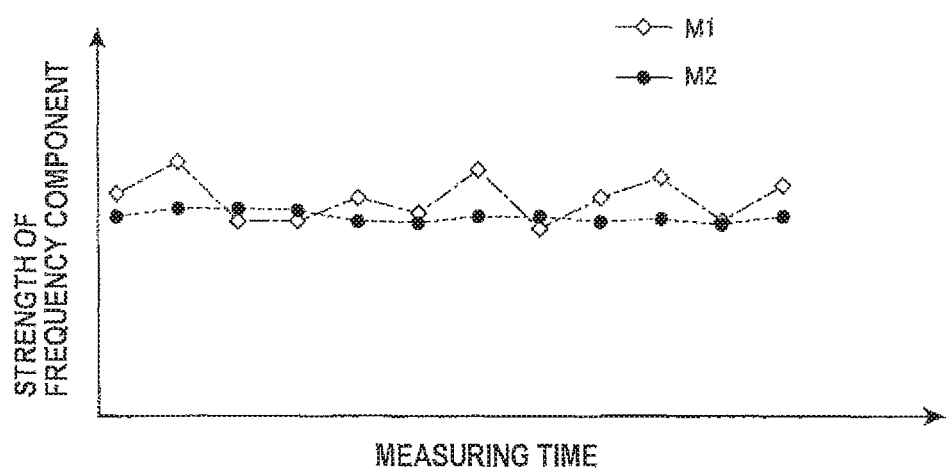
FIG. 8 is a graph showing fluctuation of two local maximum values with measuring time.

FIG. 8 is a graph showing fluctuation of the two local maximum values M1, M2 with measuring time. The ordinate axis represents the strength of the frequency component, and the abscissa axis represents measuring time. As can be seen in FIG. 8, the magnitude of fluctuation of the local maximum value M2 during the water-polishing is smaller than the magnitude of fluctuation of the local maximum value M1. In this case, therefore, the processor 32 determines the film thickness t2 corresponding to the local maximum value M2 whose magnitude of fluctuation is the smallest, and determines a selection rule for selecting the determined film thickness t2. The selection rule in this example is to select a 1st smallest (i.e. the smallest) film thickness from the candidates for a film thickness.

Figure 16:
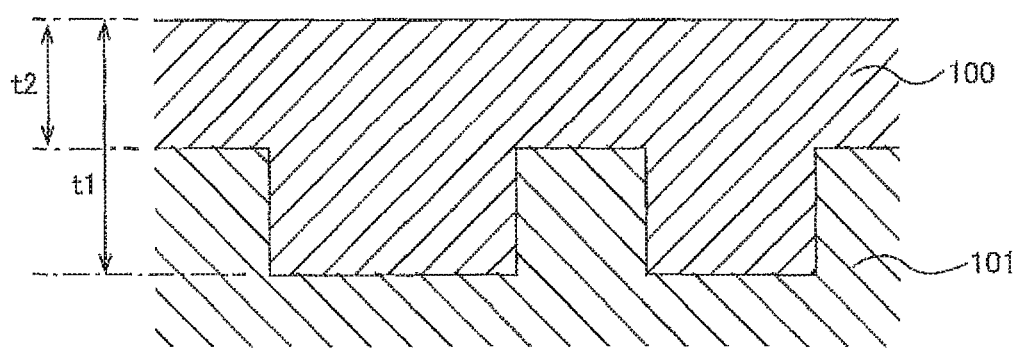
FIG. 16 is a cross-sectional view of still another example of a wafer structure.

In the example shown in FIG. 8, the more stable film thickness t2 is selected according to the selection rule. Accordingly, the processor 32 outputs the film thickness t2 as a film-thickness measurement value to the polishing controller 12. The polishing controller 12 controls polishing operations (e.g. a polishing terminating operation) based on the film thickness t2 sent from the processor 32. In the case of polishing the wafer structure shown in FIG. 16, the film, to be polished, is the exposed layer 100. In order to terminate polishing of the exposed layer 100 when the underlying layer 101 appears on the surface, it is necessary to monitor the thickness t2 of the exposed layer 100. The thickness t2 of the exposed layer 100 is therefore a film thickness to be monitored by the polishing controller 12. The polishing controller 12 terminates polishing of the wafer W when the thickness t2 of the exposed layer 100 reaches a preset target value.

However, in the selection rule determination process, a selection rule for selecting the film thickness t1 may be determined. For example, in the case where the magnitude of fluctuation of the local maximum value M1 during the water-polishing of the reference wafer is smaller than the magnitude of fluctuation of the local maximum value M2, a selection rule for selecting the film thickness t1 is determined. In such a case, the processing controller 12 calculates a corrected target value by adding an offset value to the preset target value, and terminates polishing of the wafer W when the film thickness t1, outputted from the processor 32, reaches the corrected target value. The offset value is a numerical value that has been set in advance based on the wafer structure, and is positive or negative. The offset value is inputted in advance into the polishing controller 12 by a user.

Although the selection rule is determined based on the stability of each local maximum value in the above-described embodiment, it is also possible to determine a selection rule based on the magnitude of each local maximum value. Thus, in another embodiment, a process of determining the selection rule includes the steps of: comparing a plurality of local maximum values with each other each time the local maximum values are selected (determined) during the water-polishing of the reference wafer, thereby determining the largest local maximum value; identifying a film thickness corresponding to the determined largest local maximum value; and selecting a film thickness which has been most often (most frequently) identified during the water-polishing of the reference wafer.

Figure 9:
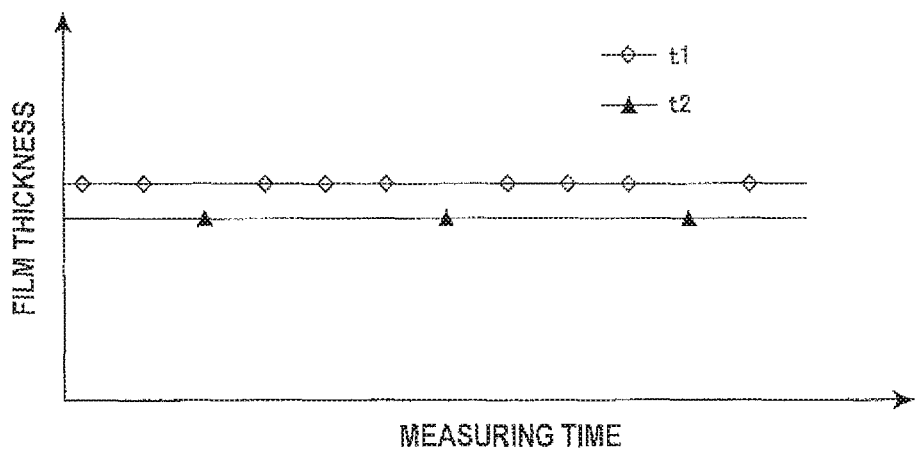
FIG. 9 is a graph showing film thicknesses, plotted along a measuring time, which have been identified as a film thickness corresponding to the largest local maximum value during water-polishing of a reference wafer.

FIG. 9 is a graph showing film thicknesses, plotted along the measuring time, which have been identified as a film thickness corresponding to the largest local maximum value during the water-polishing of the reference wafer. The ordinate axis represents film thickness, and the abscissa axis represents measuring time. As can be seen in FIG. 9, the film thickness t1 appears on the graph more often than the film thickness t2. This indicates that the number of times the film thickness t1 has been identified as a film thickness corresponding to the largest local maximum value is more than the number of times the film thickness t2 has been identified as a film thickness corresponding to the largest local maximum value. In this case, therefore, the processor 32 determines a selection rule for selecting the film thickness t1. The selection rule in this example is to select a 1st largest (i.e. the largest) film thickness from the candidates for a film thickness.

If noise tends to be generated in a particular film-thickness range in a frequency spectrum, it is desirable to determine a selection rule that can avoid such noise. For example, in a case where noise tends to be generated in a small film-thickness range, it is desirable to determine a selection rule for selecting an N-th largest film thickness. In a case where noise tends to be generated in a large film-thickness range, it is desirable to determine a selection rule for selecting an N-th smallest film thickness.

Figure 10:
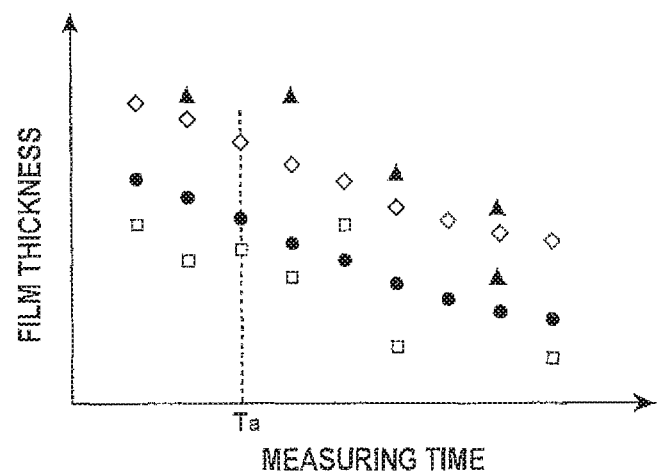
FIG. 10 is a graph showing film thicknesses which have been obtained during polishing of the reference wafer and which correspond to local maximum values that are larger than a preset provisional threshold value.

A description will now be given of an embodiment in which a threshold value for selecting local maximum values of the strength of the frequency component and a film thickness selection rule are determined simultaneously based on a measurement result of a film thickness of the reference wafer (reference substrate) having the same structure as the wafer W to be polished. FIG. 10 is a graph showing film thicknesses which have been obtained during polishing of the reference wafer and which correspond to local maximum values that are larger than a preset provisional threshold value. The film thicknesses shown in FIG. 10 are those obtained at one measurement point on the reference wafer (e.g. a measurement point at the center of the reference wafer). The provisional threshold value and the local maximum values of the strength of the frequency component are not shown in FIG. 10.

In FIG. 10, the ordinate axis represents film thickness, and the abscissa axis represents film thickness measuring time. The measuring time corresponds to the polishing time of the reference wafer. In the example shown in FIG. 10, polishing of the reference wafer is slurry-polishing using slurry as the polishing liquid. Therefore, each film thickness gradually decreases with the measuring time. It is also possible to water-polish the reference wafer.

Each time the polishing table 3 makes one revolution, local maximum values which are larger than the provisional threshold value are selected from all the local maximum values obtained at the predetermined one measurement point. For example, at a time Ta, three local maximum values, which are larger than the provisional threshold values, are selected. Accordingly, three film thicknesses exist at the one measurement point at the time Ta.

Figure 11:
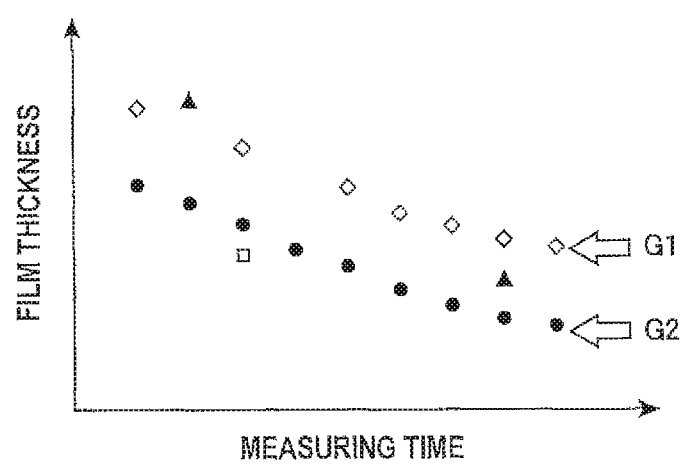
FIG. 11 is a graph showing film thicknesses corresponding to local maximum values which are selected when the provisional threshold value is increased.

Next, the provisional threshold value is increased gradually. FIG. 11 is a graph showing film thicknesses corresponding to local maximum values which are selected when the provisional threshold value is increased. As will be appreciated from a comparison of FIGS. 10 and 11, as a result of the increase in the provisional threshold value, a small local maximum value(s) is not selected, and therefore the number of selected local maximum values decreases. Accordingly, the number of film thicknesses appearing on the graph decreases. Small local maximum values are in most cases noise. Such noise can therefore be eliminated by increasing the provisional threshold value. Accordingly, as shown in FIG. 11, the changes in the film thicknesses on the graph are the decrease in the film thicknesses with the measuring time (i.e. the decrease in a stable manner). The increased provisional threshold value is determined to be the threshold value for use in measuring of the film thickness of the wafer W to be polished.

There are two groups G1 and G2 of the film thicknesses appearing in FIG. 11. The number of film thicknesses belonging to the group G2 is larger than the number of film thicknesses belonging to the group G1. This indicates that the change in film thickness belonging to the group G2 more accurately reflects the change in film thickness of the reference wafer than the change in film thickness belonging to the group G1. Of the groups G1 and G2, the group G2 is a group to which the smallest film thickness belongs. Therefore, the selection rule in this example is to select a 1st smallest (i.e. the smallest) film thickness from the candidates for a film thickness. In this manner, the threshold value and the selection rule for a film thickness can be determined simultaneously from the measurement result of the film thickness of the reference wafer.

The above-described film-thickness measuring method can be applied not only to measuring of a film thickness during polishing of a wafer, but it can also be applied to measuring of a film thickness performed when a wafer and a polishing table are stationary.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a film-thickness measuring method and a film-thickness measuring apparatus which detect a film thickness by analyzing optical information contained in reflected light from a substrate. The present invention is also applicable to a polishing method and a polishing apparatus which employ such film-thickness measuring method and film-thickness measuring apparatus.

REFERENCE SIGNS LIST 1 polishing pad
3 polishing table
5 polishing head
10 polishing-liquid supply nozzle
12 polishing controller
16 polishing head shaft
17 coupling device
18 polishing head motor
19 table motor
25 optical film-thickness measuring device (film-thickness measuring apparatus)
31 film-thickness measuring head
32 processor
42 light emitter
43 light receiver (optical fiber)
44 spectrometer
47 light source
48 optical fiber
50A first hole
50B second hole
51 through-hole
53 liquid supply passage
54 liquid discharge passage
55 liquid supply source

The invention claimed is:

1. A film-thickness measuring method comprising:
directing light to a substrate having a film formed on a surface thereof;
producing a spectral waveform indicating a relationship between intensity and wavelength of reflected light from the substrate;
performing Fourier transform processing on the spectral waveform to determine strengths of frequency components and corresponding film thicknesses;
determining a plurality of local maximum values of the strengths of the frequency components; and
selecting, according to a preset selection rule, one film thickness from a plurality of film thicknesses corresponding respectively to the plurality of local maximum values,
wherein the preset selection rule is either to select an N-th largest film thickness or to select an N-th smallest film thickness, N being a predetermined natural number, and
the preset selection rule is predetermined based on a result of measuring a film thickness of a reference substrate having the same structure as said substrate, measuring of the film thickness of the reference substrate being performed with the same process as measuring of a film thickness of said substrate.

2. The film-thickness measuring method according to claim 1, wherein the plurality of local maximum values are determined based on a comparison with a threshold value.

3. The film-thickness measuring method according to claim 2, wherein the threshold value is a value determined from a previous measurement result of a film thickness.

4. The film-thickness measuring method according to claim 1, wherein measuring of the film thickness of the reference substrate is performed while water-polishing the reference substrate.

5. The film-thickness measuring method according to claim 1, wherein a process of determining the selection rule comprises:
calculating a magnitude of fluctuation of each of a plurality of local maximum values which are determined during measuring of the film thickness of the reference substrate; and
selecting a film thickness corresponding to a local maximum value whose magnitude of fluctuation is the smallest.

6. The film-thickness measuring method according to claim 1, wherein a process of determining the selection rule comprises:
comparing a plurality of local maximum values with each other each time the local maximum values are determined during measuring of the film thickness of the reference substrate, thereby determining a largest local maximum value;
identifying a film thickness corresponding to the largest local maximum value; and
selecting a film thickness which has been most frequently identified.

7. A film-thickness measuring apparatus comprising:
a light emitter configured to direct light to a substrate having a film formed on a surface thereof;
a light receiver configured to receive reflected light from the substrate;
a spectrometer configured to measure an intensity of the reflected light at each of wavelengths; and
a processor configured to produce a spectral waveform indicating a relationship between intensity and wavelength of the reflected light, the processor being configured to
perform Fourier transform processing on the spectral waveform to determine strengths of frequency components and corresponding film thicknesses,
determine a plurality of local maximum values of the strengths of the frequency components, and
select, according to a preset selection rule, one film thickness from a plurality of film thicknesses corresponding respectively to the plurality of local maximum values,
wherein the preset selection rule is either to select an N-th largest film thickness or to select an N-th smallest film thickness, N being a predetermined natural number, and
the preset selection rule is predetermined based on a result of measuring a film thickness of a reference substrate having the same structure as said substrate, measuring of the film thickness of the reference substrate being performed with the same process as measuring of a film thickness of said substrate.

8. The film-thickness measuring apparatus according to claim 7, wherein the processor is configured to determine the plurality of local maximum values based on a comparison with a threshold value.

9. A polishing method comprising:
directing light to a substrate having a film formed on a surface thereof while rubbing the substrate against a polishing surface;
producing a spectral waveform indicating a relationship between intensity and wavelength of reflected light from the substrate;
performing Fourier transform processing on the spectral waveform to determine strengths of frequency components and corresponding film thicknesses;
determining a plurality of local maximum values of the strengths of the frequency components; and
selecting, according to a preset selection rule, one film thickness from a plurality of film thicknesses corresponding respectively to the plurality of local maximum values,
wherein the preset selection rule is either to select an N-th largest film thickness or to select an N-th smallest film thickness, N being a predetermined natural number and being variable depending on a structure of the substrate.

10. The polishing method according to claim 9, further comprising:
terminating polishing of the substrate when the selected film thickness reaches a preset target value.

11. The polishing method according to claim 10, further comprising:
calculating a corrected target value by adding an offset value to the target value, wherein polishing of the substrate is terminated when the selected film thickness reaches the corrected target value.

12. The polishing method according to claim 9, wherein the plurality of local maximum values are determined based on a comparison with a threshold value.

13. A polishing apparatus comprising:
a polishing table configured to support a polishing pad having a polishing surface;
a polishing head configured to press a substrate, having a film formed on a surface thereof, against the polishing surface;
a light emitter configured to direct light to the substrate;
a light receiver configured to receive reflected light from the substrate;
a spectrometer configured to measure an intensity of the reflected light at each of wavelengths;
a processor configured to produce a spectral waveform indicating a relationship between intensity and wavelength of the reflected light; and
a polishing controller configured to control polishing of the substrate, the processor being configured to:
perform Fourier transform processing on the spectral waveform to determine strengths of frequency components and corresponding film thicknesses,
determine a plurality of local maximum values of the strengths of the frequency components, and
select, according to a preset selection rule, one film thickness from a plurality of film thicknesses corresponding respectively to the plurality of local maximum values,
wherein the preset selection rule is either to select an N-th largest film thickness or to select an N-th smallest film thickness, N being a predetermined natural number and being variable depending on a structure of the substrate.

14. The polishing apparatus according to claim 13, wherein the polishing controller is configured to terminate polishing of the substrate when the selected film thickness reaches a preset target value.

15. The polishing apparatus according to claim 14, wherein the polishing controller is configured to calculate a corrected target value by adding an offset value to the target value, and terminate polishing of the substrate when the selected film thickness reaches the corrected target value.

16. The polishing apparatus according to claim 13, wherein the processor is configured to determine the plurality of local maximum values based on a comparison with a threshold value.

17. The film-thickness measuring apparatus according to claim 7, wherein the preset selection rule is predetermined based on a result of measuring a film thickness of a reference substrate having the same structure as said substrate, measuring of the film thickness of the reference substrate being performed with the same process as measuring of a film thickness of said substrate.

18. The polishing apparatus according to claim 13, wherein the preset selection rule is predetermined based on a result of measuring a film thickness of a reference substrate having the same structure as said substrate, measuring of the film thickness of the reference substrate being performed with the same process as measuring of a film thickness of said substrate.

\* \* \* \* \*